April 14, 1970 G. F. HARDY ET AL 3,506,886

HIGH POWER TRANSISTOR ASSEMBLY

Filed March 8, 1965 2 Sheets-Sheet 1

INVENTORS
GEORGE F. HARDY
RICHARD H. WINKLER
SIDNEY LEVINE

BY Flehr and Swain
ATTORNEYS

HIGH POWER TRANSISTOR ASSEMBLY

Filed March 8, 1965 2 Sheets-Sheet 2

INVENTORS
GEORGE F. HARDY
RICHARD H. WINKLER
SIDNEY LEVINE
BY
Flehr and Swain
ATTORNEYS 3,506,886

HIGH POWER TRANSISTOR ASSEMBLY

George F. Hardy, Sunnyvale, Richard H. Winkler, Palo Alto, and Sidney Levine, San Jose, Calif., assignors to International Telephone and Telegraph Corporation, Nutley, N.J., a corporation of Delaware

Filed Mar. 8, 1965, Ser. No. 437,960
Int. Cl. H01l *3/00, 5/00, 11/00*
U.S. Cl. 317—234 6 Claims

This invention relates generally to a high power transistor assembly and more particularly to a high frequency, high power transistor assembly.

When operating transistors at high powers in the order of 2 watts and above, the removal of heat generated in the semiconductive material and the equalization of temperature in the material becomes important and limiting. The semiconductive material should be in good heat exchange relationship with the header. Uniform operation over the entire area of the transistor minimizes hot spots and permits operation at higher power. At the high frequency, the impedance of the leads increases, and it is important that it be controlled and tailored to minimize interelectrode and distributed constant effects. A proper design of the leads aids in distributing the current over the area of the transistor, and when two transistors are operated in parallel, between transistors.

It is a general object of the present invention to provide an improved high power, high frequency transistor assembly.

It is another object of the present invention to provide a transistor assembly which provides improved heat transfer from the semiconductive body.

It is a further object of the present invention to provide a transistor in which the header forms the emitter connection.

It is still a further object of the present invention to provide a transistor which includes series resistance between the header and the emitter regions in the transistor to ensure uniform operation.

It is a further object of the present invention to provide a transistor having a plurality of emitter regions each connected to the emitter lead through a series resistance.

It is still a further object of the present invention to provide a transistor in which the impedance of the electrical leads at high frequencies is minimized and equalized.

The foregoing and other objects of the invention will become more clearly apparent from the following description taken in conjunction with the accompanying drawings.

Referring to the drawings.

Figure 1:
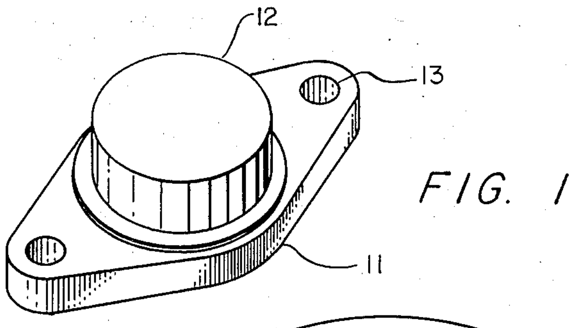
FIGURE 1 is a perspective view of a transistor assembly in accordance with the invention.

The transistor assembly includes a header 11 which serves to carry the semiconductor material forming the transistor, other parts of the assembly, and the lead structure. The header 11 is adapted to receive a cap 12 which serves to house and protect the assembly from its surroundings. The header may include a pair of spaced mounting holes 13 whereby it can be secured to associated equipment as by screws. It is, of course, to be understood that the header may be of any known type as, for example, the type which includes a threaded post for threading directly into associated apparatus.

The transistor 16, to be presently described in detail, is carried by a heat transfer sandwich 17 which electrically insulates the transistor from the header. The sandwich preferably includes materials which will have a thermal coefficient of expansion substantially equal to the thermal coefficient of expansion of the transistor chip 16 whereby to minimize the fractures due to differentials in thermal expansion. In a silicon transistor, the sandwich may, for example, include a molybdenum shim 18 which is suitably soldered to the header which may be made of copper, in accordance with conventional practice. A second molybdenum shim 19 is soldered to the collector region of the chip or wafer of semiconductive material which forms the transistor. A layer of beryllium oxide 21 is disposed between the molybdenum shims to provide a mechanical connection. The connection provides electrical insulation. The beryllium oxide layer 21 is relatively thin and has good heat conductivity whereby the thermal conduction between the transistor 16 and header 11 is relatively good.

The assembly shown includes a pair of transistors **16*a*, 16*b* disposed in end-to-end relationship with respect to one another. A pedestal 22 made of material having good electrical conductivity is mounted along each side of the transistor in parallel relationship thereto. The top of the pedestal is substantially at the same height as the top of the transistors. The upper portion of the pedestal may carry a molybdenum shim 23 which is suitably bonded to the copper pedestal and which serves to carry a silicon wafer 24. The upper surface of the wafer may be provided with an evaporated ohmic contacting layer. Short emitter leads 26 are connected between the ohmic surface contact and the emitter regions of the associated transistor. The emitter current path then includes the header, the pedestal, the silicon wafer 24 and the emitter leads 26. The silicon wafer 24** provides a series resistance. The resistance of the silicon wafer may be controlled by controlling its thickness, impurity concentration, etc., to provide the desired resistance in series with each of the leads.

The base electrode comprises a C-shaped member 27 with the ends 28 extending towards one another and over the underlying transistor. The center of the "C" is connected to a post 29 which extends through the header. The post is supported on the header by a glass insulating bead 30 which forms a sealed lead-in assembly. Base leads which form ohmic contact with the base region of the transistor extend upwardly and are connected between the C-shaped lead and the ohmic base connection.

The collector terminal comprises a U-shaped strap 31 which has a 90° bend at 32 and which is then suitably affixed to the outwardly extending molybdenum tab portion 33 of the shims 19. It is seen that one of these tabs extends to each side of the aligned transistors and the two ends of the U-shaped collector strap have one end connected to each. The center of the U-shaped collector strap is connected to a post 34 which extends through the header. The post is supported on the header by a glass insulating bead 35 which forms a sealed lead-in assembly.

Figures 4, 5, 6:
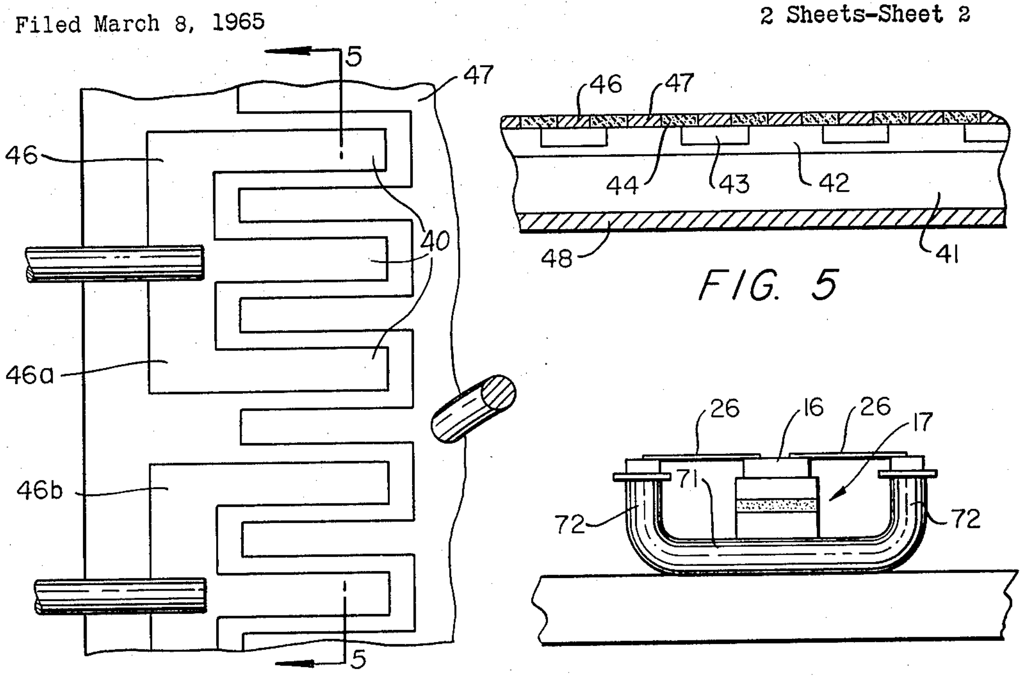
FIGURE 4 is an enlarged view of a portion of the transistor showing emitter and base connections.
FIGURE 5 is a view taken along the line 5—5 of FIGURE 4.
FIGURE 6 shows another transistor assembly in accordance with the invention.

The power transistor is illustrated more clearly in FIGURES 4 and 5. The transistor comprises a collector region 41, a base region 42 forming a base-collector junction therewith, and inset emitter regions 43.

The transistor structure is of the interdigitated type as shown in FIGURE 4 with the emitter including a plurality of fingers 40. The portions of the emitter-base junctions extending to the surface are protected by an oxide layer 44. Emitter contacts 46 and base contacts 47 are formed by evaporating an interdigitated contact pattern on the surface of the device. The contact pattern is essentially a base rib structure with comb-like emitter contacts. Collector lead 48 is formed by the molybdenum shim previously described.

Figure 2:
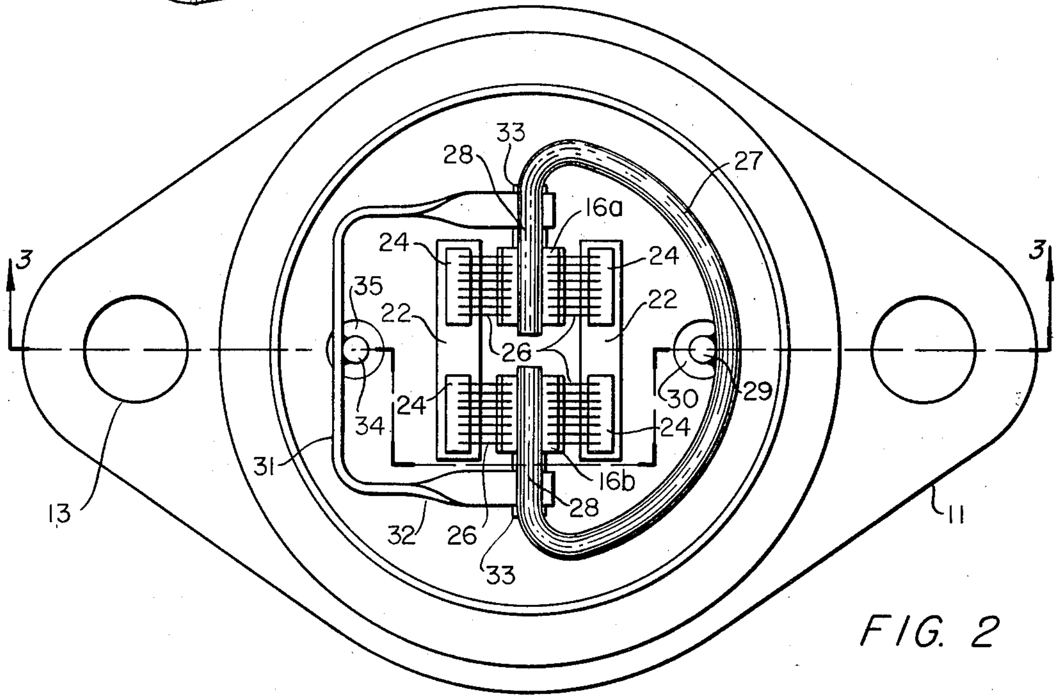
FIGURE 2 is a plan view of the transistor assembly of FIGURE 1 with the cover removed to show the internal arrangement of leads and semiconductive material.
Figure 3:
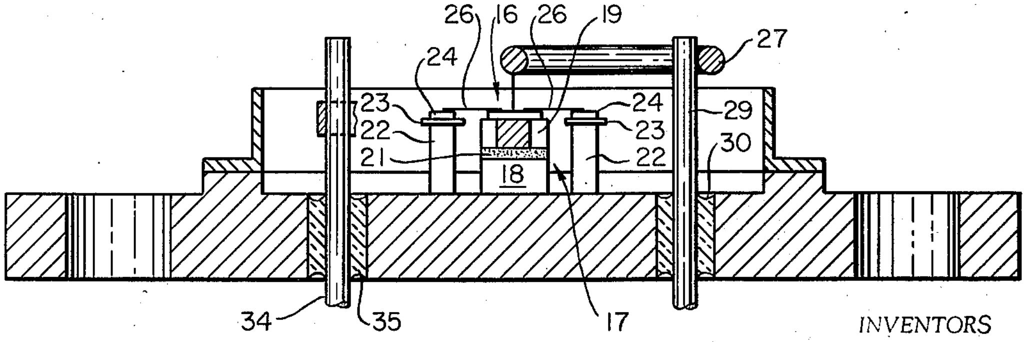
FIGURE 3 is a sectional view taken along the line 3—3 of FIGURE 2.

The emitter comb-like contact is separated to form a plurality of such contacts **46*a*, 46*b*, etc. As shown in FIGURE 2, there are eight such emitter regions or sections, each connected to an emitter lead 26. The emitter leads are, in turn, connected to the emitter resistor 24. Thus, there is in series with each of the emitter contacts 46** a series resistance. The series emitter resistance serves to assure that the current flowing to each of the emitter regions is substantially equal. It is apparent that if the current in any one of the series paths increases, the voltage drop in the resistor increases and the emitter voltage decreases, thereby reducing the current. Thus, there is a negative feedback effect tending to assure that the current carried by the transistor is equally distributed.

It is to be realized that at high frequency each of the leads will have a distributed impedance. This impedance is in series with the respective region. It is preferable that the distributed impedance of the emitter leads be reduced as much as possible. In the structure shown the emitter leads 26 are relatively short. The path through the emitter resistor and pedestal is relatively short, and the size of the resistor and pedestal is such as to minimize the series inductance. Thus, there is provided good transmission signal to the emitter region. There is only small likelihood that the high frequency impedance of the various paths will be substantially different since, except for the short lead portions 26, the path is identical.

Base regions for the devices are connected through C-shaped leads. Because of the balanced configuration, the distributed impedance of the two halves are substantially equal whereby to assure that the two transitors each share the load. The U-shaped collector leads are symmetrical whereby to tend to balance the operation. Thus, the pair of devices will operate substantially equally under varying frequency and load conditions.

Figures 7, 8:
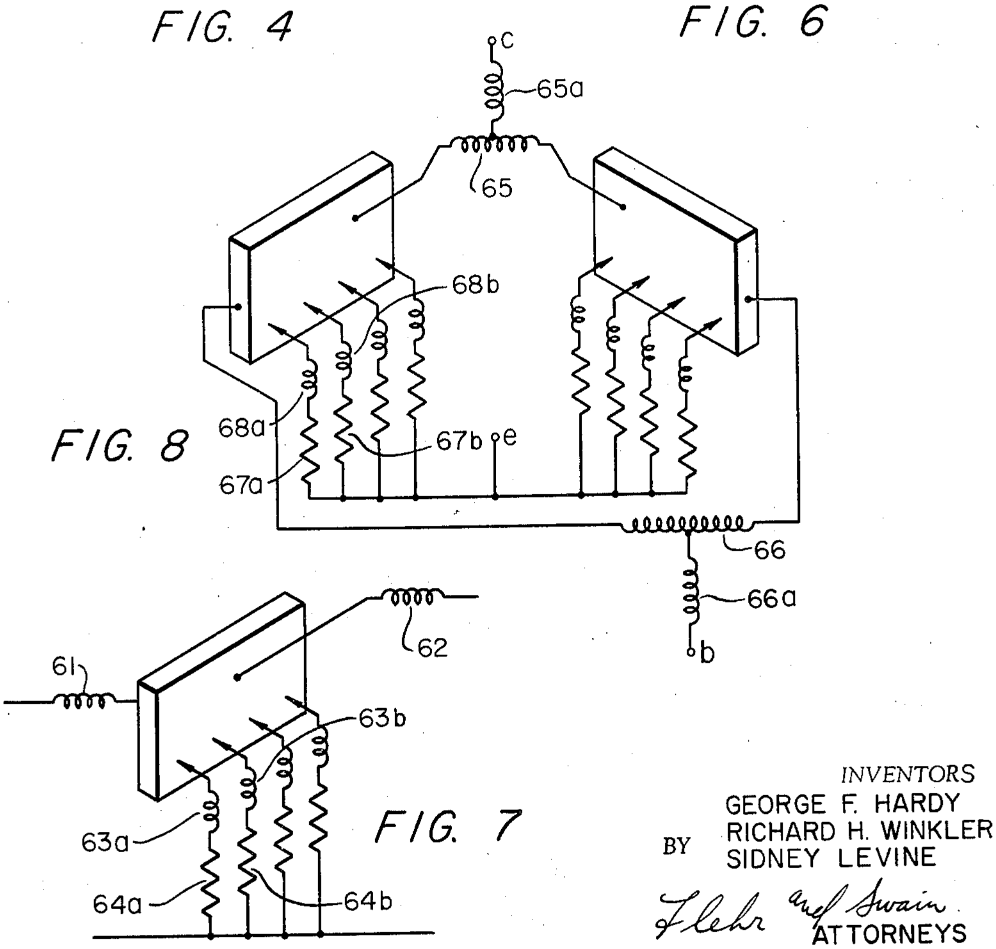
FIGURE 7 shows an equivalent circuit for a transistor in accordance with the invention.
FIGURE 8 shows a circuit diagram for a dual transistor encapsulated in a single capsule in accordance with the present invention.

The equivalent circuit for a single transistor connected in accordance with the invention would be substantially as shown in FIGURE 7 where the inductance of the base lead is shown at 61, the inductance of the collector lead at 62, and the individual inductances of the emitter leads are shown at **63*a*, 63*b*, etc., associated with a schematically represented plurality of emitter contacts. The series resistance is shown at 64*a*, 64*b***, etc.

For the balanced device, the circuit is substantially as shown in FIGURE 8 wherein the inductance 65 associated with the collector regions is balanced and a series inductance **65*a* is included for the portion of the lead extending through the glass bead and header. Likewise, the inductance of the C-shaped portion of the base terminal is shown at 66, while the lead-in inductance is shown at 66*a*. There is shown a plurality of emitter resistors 67*a*, 67*b*, etc., associated with each emitter and these resistors will have substantially equal resistance since they are formed from a single silicon wafer which is mounted on the pedestal. There is also illustrated the lead inductance 68*a*, 68*b***, etc.

The pedestals may comprise the arms of a U-shaped channel which serves to receive the heat transfer sandwich 17 and which, in turn, is secured to the header. This may then be formed as a sub-assembly and then mounted on the header. In FIGURE 6 there is shown a portion of the header having mounted thereon a U-shaped channel 71 having pedestals 72. The sub-assembly including transistor 16, sandwich 17, emitter leads 26 and channel 71 with pedestal 72 is clearly illustrated. The remainder of the assembly would be substantially identical to that described above.

Thus, there is provided a high power transistor structure which is easy to assemble in which the unbalance of the distributed constant at high frequency is minimized and which may be operated either in balanced or unbalanced configuration at relatively high frequencies. The series resistors serve to assure that the current is equally distributed through the device to minimize hot spots. The mounting arrangement provides good heat conduction from the wafer.

We claim:

1. A transistor assembly comprising a header, first and second transistors each including base, collector and emitter regions, a heat conductive electrically insulating means supporting each of said transistors on said header, said means including a collector contact forming ohmic connection to the collector regions of each of said transistors and extending outwardly therefrom, an emitter pedestal disposed adjacent said transistors and having one end connected to the header and the other end disposed adjacent to the transistors, leads forming an electrical connection between said pedestal and the emitter regions of each of said transistors whereby said header forms the common emitter terminal for said transistors, base and collector posts extending upwardly into said header, insulating means for supporting said posts on said header, a U-shaped collector lead supported on said collector post and having each of its legs connected to one of said collector contacts, a C-shaped base lead supported on said base post and extending over said transistors with the fingers of the "C" disposed above the transistors, and leads extending between the base regions and the C-shaped member.

2. A transistor assembly as in claim 1 wherein said transistor comprises silicon semiconductive material and said heat conductive insulating means comprises a sandwich including outer shims formed of molybdenum and an oxide layer disposed between the shims and providing electrical insulation, one of said shims being ohmically connected to the collector to form the collector contact and the other being ohmically connected to the header.

3. A transistor assembly comprising a header, first and second transistors each including base, collector and emitter regions, the emitter regions of each of said transistors including a plurality of operating portions, a heat conductive electrically insulating supporting means supporting each of said transistors, said means including a collector contact forming ohmic contact with the collector region of each of said transistors, an emitter pedestal adjacent said transistors and having one end connected to the header and the other disposed adjacent to the transistors, a layer of silicon carried on said pedestal and forming ohmic connection thereto, a plurality of emitter leads extending between the emitter portions of each of said transistors and the silicon material and forming ohmic connection therewith whereby there is provided in series with each of said leads a resistance which is determined by the silicon layer, base and collector posts extending upwardly through said header, means for supporting said posts on said header in insulated relationship thereto, a collector lead extending between said collector post and each of said collector contacts, said collector lead presenting a low substantially equal impedance between the collector post and the collector contact, and a base lead extending between said base post and the base of the transistor, said base lead presenting a low substantially equal impedance between the base post and the base region of the transistor.

4. A transistor assembly comprising:

a header;

first and second transistors each including base, collector and emitter regions;

a heat conductive electrically insulating means supporting each of said transistors on said header, said means including a collector contact forming ohmic connection to the collector regions of each of said transistors and extending outwardly therefrom;

an emitter pedestal disposed adjacent said transistors and having one end connected to the header and the other end disposed adjacent to the transistors;

leads forming an electrical connection between said pedestal and the emitter regions of each of said transistors whereby said header forms the common emitter terminal for said transistors;

base and collector posts supported by and insulated from said header;

a collector lead supported on said collector post, said collector lead having a pair of symmetrical legs each connected to a respective one of said collector contacts; and a base lead supported on said base post, said base lead having a pair of symmetrical legs each connected to a respective one of said first and second transistor base regions.

5. A transistor assembly according to claim 4 wherein at least one of said emitter regions comprises a plurality of operating portions, further comprising a layer of resistive material forming ohmic connection to the upper surface of said pedestal, and a plurality of emitter leads extending between each of said emitter portions and the resistive material and forming ohmic connection therewith whereby there is provided in series with each of said emitter leads a resistance defined by said resistive means.

6. A transistor assembly according to claim 4, wherein said emitter pedestal is directly secured to said supporting means to form a unitary subassembly.

References Cited

UNITED STATES PATENTS

| | | | |
|---|---|---|---|
| 2,887,628 | 5/1959 | Zierdt | 317—234 |
| 3,025,437 | 3/1962 | Van Namen et al. | 317—235 |
| 3,074,145 | 1/1963 | Rowe | 317—235 |
| 3,095,526 | 6/1963 | Thornton | 317—235 |
| 3,187,240 | 6/1965 | Clark | 317—234 |
| 3,195,026 | 7/1965 | Wegner et al. | 317—234 |
| 3,225,261 | 12/1965 | Wolf | 317—235 |
| 3,259,814 | 7/1966 | Green | 317—234 |

FOREIGN PATENTS

| | | |
|---|---|---|
| 1,358,189 | 3/1964 | France. |

JOHN W. HUCKERT, Primary Examiner

R. F. POLISSACK, Assistant Examiner

U.S. Cl. X.R.

317—235